United States Patent
Liu et al.

(10) Patent No.: US 12,191,896 B2
(45) Date of Patent: *Jan. 7, 2025

(54) RADIO FREQUENCY TRANSMITTER WITH DYNAMIC IMPEDANCE MATCHING FOR HIGH LINEARITY

(71) Applicant: QUALCOMM Incorporated, San Diego, CA (US)

(72) Inventors: Edward Wai Yeung Liu, San Diego, CA (US); Vladimir Aparin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 72 days.

This patent is subject to a terminal disclaimer.

(21) Appl. No.: 18/055,339

(22) Filed: Nov. 14, 2022

(65) Prior Publication Data

US 2023/0074461 A1    Mar. 9, 2023

Related U.S. Application Data

(63) Continuation of application No. 17/061,984, filed on Oct. 2, 2020, now Pat. No. 11,502,706.

(51) Int. Cl.
*H04B 1/04* (2006.01)
*H03M 1/66* (2006.01)

(52) U.S. Cl.
CPC ............... *H04B 1/04* (2013.01); *H03M 1/66* (2013.01)

(58) Field of Classification Search
CPC ..... H01L 27/14679; H01L 2224/05599; H01L 2224/45099; H01L 2224/48091; H01L 2224/48137; H01L 2224/48247; H01L 2224/49175; H01L 24/48; H01L 24/49; H01L 2924/00; H01L 2924/00014; H01L 2924/01006; H01L 2924/01019; H01L 2924/01029; H01L 2924/01033; H01L 2924/01041; H01L 2924/01074; H01L 2924/014; H01L 2924/1306; H01L 2924/13091; H01L 2924/14; H01L 2924/15311; H01L 2924/3011; H03F 1/56; H03F 3/24; H03F 1/0294; H03F 3/68;

(Continued)

(56) References Cited

U.S. PATENT DOCUMENTS 8,446,173 B1   5/2013  Faucher et al.
9,520,906 B2  12/2016  Butterfield et al.
(Continued)

OTHER PUBLICATIONS

International Search Report and Written Opinion—PCT/US2021/048994—ISA/EPO—Dec. 9, 2021.
(Continued)

*Primary Examiner* — Golam Sorowar
(74) *Attorney, Agent, or Firm* — Patterson & Sheridan, L.L.P/Qualcomm Incorporated

(57) ABSTRACT

Certain aspects of the present disclosure are directed to a radio frequency digital-to-analog converter (RFDAC). The RFDAC generally includes a plurality of digital-to-analog (DAC) unit cells. At least one DAC unit cell is capable of being configured in an active state or in a sleep state. For the at least one DAC unit cell, an output impedance of the DAC unit cell in the active state is equal to an output impedance of the DAC unit cell in the sleep state.

23 Claims, 12 Drawing Sheets

(58) Field of Classification Search
CPC ........ H03F 1/02; H03F 1/0227; H03F 1/0238; H03F 1/32; H03F 1/3247; H03F 2200/331; H03F 2200/336; H03F 2200/387; H03F 2200/423; H03F 2200/451; H03F 2200/534; H03F 2200/537; H03F 2200/78; H03F 2200/99; H03F 2201/3231; H03F 2203/21112; H03F 2203/21157; H03F 3/19; H03F 3/211; H03F 3/602; H03F 1/34; H03F 3/20; H03F 3/72

See application file for complete search history.

(56) References Cited

U.S. PATENT DOCUMENTS

| | | | |
|---|---|---|---|
| 9,531,409 | B2 | 12/2016 | Butterfield et al. |
| 9,602,119 | B1 | 3/2017 | Maulik et al. |
| 2011/0221620 | A1* | 9/2011 | Mahajan ............. H03K 17/063 341/150 |
| 2012/0169565 | A1 | 7/2012 | Morris, III |
| 2014/0344200 | A1* | 11/2014 | Schie ................ G02B 6/3863 706/20 |
| 2016/0094235 | A1* | 3/2016 | Kuttner ............... H03M 1/662 341/144 |
| 2017/0373641 | A1* | 12/2017 | Vandenameele ....... H03D 7/165 |
| 2018/0302058 | A1 | 10/2018 | Hershberg et al. |
| 2018/0314285 | A1* | 11/2018 | Susanto ................ G05F 3/262 |
| 2018/0375488 | A1 | 12/2018 | Sira |
| 2019/0280705 | A1* | 9/2019 | Bodnar ................ H03M 1/802 |
| 2020/0112471 | A1* | 4/2020 | Mehrpoo ............... H04B 1/04 |
| 2021/0218429 | A1* | 7/2021 | Stuenkel ............. H03H 11/04 |
| 2022/0109460 | A1 | 4/2022 | Liu |

OTHER PUBLICATIONS

Maxim Integrated: "Predistortion Techniques vs Operation in Backoff", 2014, URL: https://www.maximintegrated.com/en/products/comms/wireless-rf/rf-predistorters/predistortion-linearization/rfpal-technology/predistortion-techniques-vs-operation-backoff.html, pp. 1-9.

Ritesh B., et al., "Wideband Mixed-Domain Multi-Tap Finite-Impulse Response Filtering of Out-of-Band Noise Floor in Watt-Class Digital Transmitters", IEEE Journal of Solid-State Circuits, IEEE, USA, vol. 52, No. 12, Dec. 1, 2017 (Dec. 1, 2017), pp. 3405-3420, XP011673299, ISSN: 0018-9200, DOI: 10.1109/JSSC. 2017.2760899 [retrieved on Nov. 22, 2017] figures 1-9, abstract, p. 3405, left-hand column, line 36, p. 3414. right-hand column, line 38.

Yoo S-M., et al., "A Switched-Capacitor Power Amplifier for EER/Polar Transmitters", 2011 IEEE International Solid- State Circuits Conference, Feb. 23, 2011, pp. 428-430.

* cited by examiner

| Case | Prob. Density Func | Rout |
|---|---|---|
| Sleep | PDF | Ron |
| Active-Slow | PDF | ~Ron |
| Active-Fast | PDF  0   Vbot   2*vddx | Rdyn > Ron |

RADIO FREQUENCY TRANSMITTER WITH DYNAMIC IMPEDANCE MATCHING FOR HIGH LINEARITY

CROSS-REFERENCE TO RELATED APPLICATIONS

This application is a continuation of U.S. patent application Ser. No. 17/061,984, filed Oct. 2, 2020, which is assigned to the assignee hereof and hereby expressly incorporated by reference in its entirety as if fully set forth below and for all applicable purposes.

TECHNICAL FIELD

Certain aspects of the present disclosure generally relate to electronic circuits and, more particularly, to a radio frequency digital-to-analog converter (RFDAC) for use in direct-to-RF transmitter architectures.

BACKGROUND

A wireless communication network may include a number of wireless communication devices, such as base stations (BSs) and mobile stations (MSs). Each wireless communication device includes a transmitter for transmitting signals and a receiver for receiving signals. The receiver often downconverts an analog radio frequency (RF) signal to an analog baseband signal or analog intermediate frequency (IF) signal which is filtered, amplified, and converted to a digital baseband signal in an analog-to-digital converter (ADC). Likewise, the transmitter typically converts a baseband digital signal to an analog signal, which is filtered and upconverted to an RF signal before being transmitted.

SUMMARY

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

Certain aspects of the present disclosure relate to a digital-to-analog (DAC) configured to output a radio frequency (RF) modulated signal. The DAC generally includes a plurality of DAC unit cells. For at least one of the plurality of DAC unit cells, the DAC unit cell is capable of being configured in an active state or in a sleep state, and an output impedance of the DAC unit cell in the active state is equal to an output impedance of the DAC unit cell in the sleep state.

Certain aspects of the present disclosure relate to a wireless communication device. The wireless communication device generally includes the DAC described herein. The wireless communication device further includes a digital signal processor (DSP) configured to produce a digital signal. The DAC is configured to upconvert an output of the DSP to the RF modulated signal.

Certain aspects of the present disclosure are directed to a method of generating a radio frequency (RF) signal. The method generally includes receiving a digital signal. The method also includes converting the digital signal into the RF signal via a plurality of digital-to-analog (DAC) unit cells, comprising controlling at least one of the plurality of DAC unit cells, such that an output impedance of the at least one DAC unit cell when the DAC unit cell is in a sleep state is equivalent to an output impedance of the DAC unit cell when the DAC unit cell is in an active state.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Figure 1:
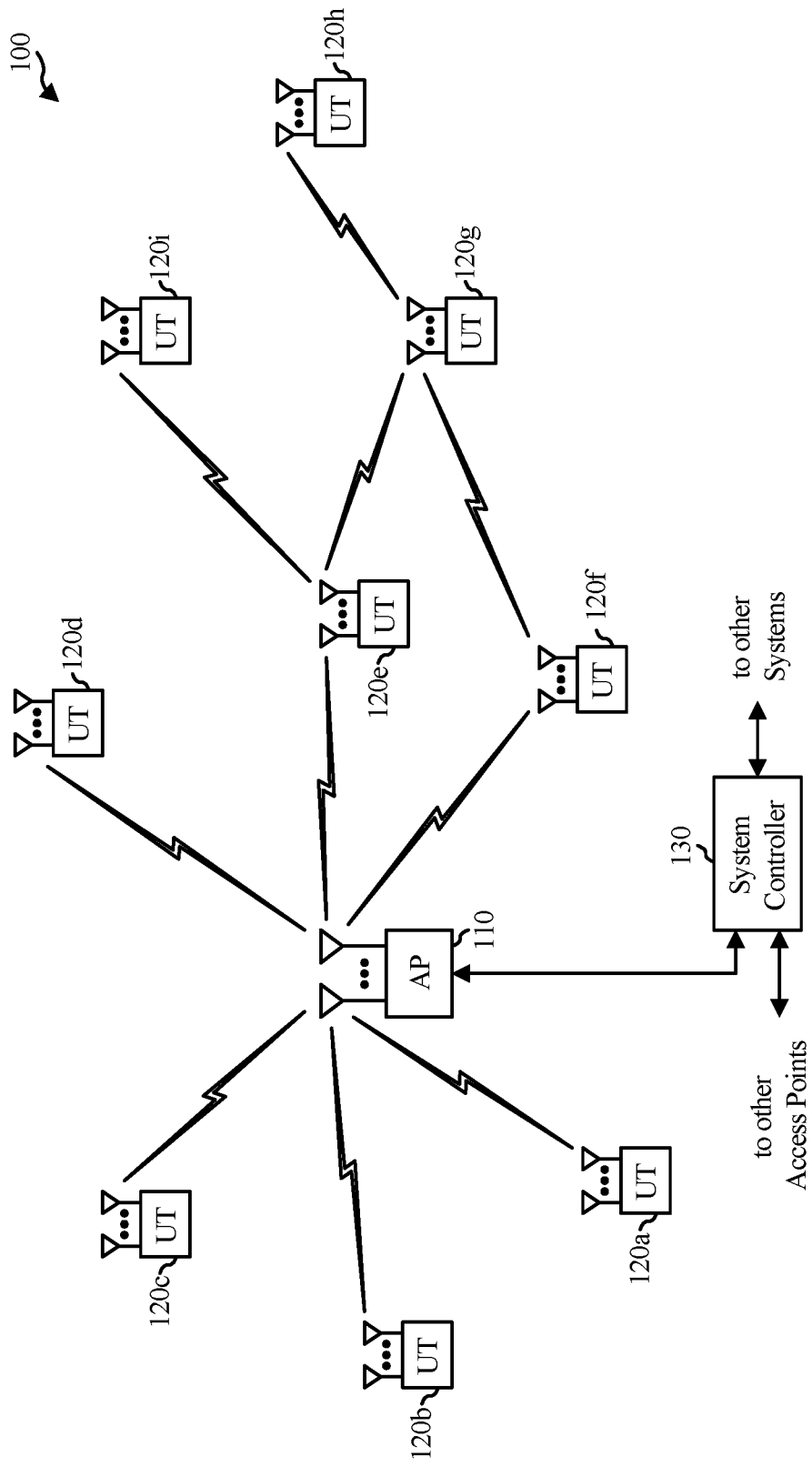
FIG. 1 is a diagram of an example wireless communications network, in which certain aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a radio frequency digital-to-analog converter (RFDAC)-based transmitter, as described in more detail herein.

Figure 2:
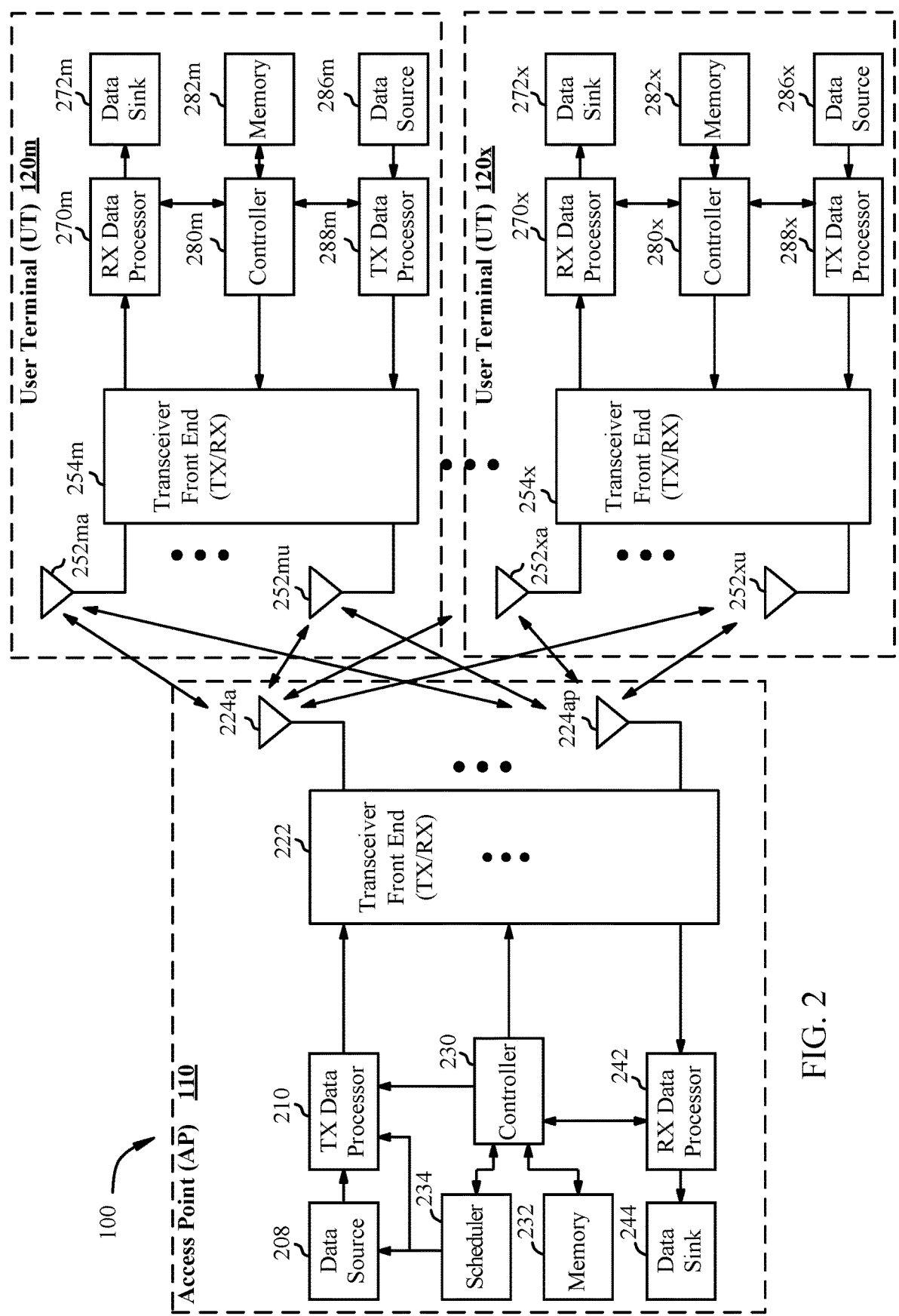
FIG. 2 is a block diagram of an example access point (AP) and example user terminals, in which certain aspects of the present disclosure may be practiced.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. In one aspect, TX data processor 288 is a digital signal processor (DSP) that can be configured to implement one or more techniques described herein. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include an RFDAC, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. In one aspect, TX data processor 210 is a DSP that can be configured to implement one or more techniques described herein. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
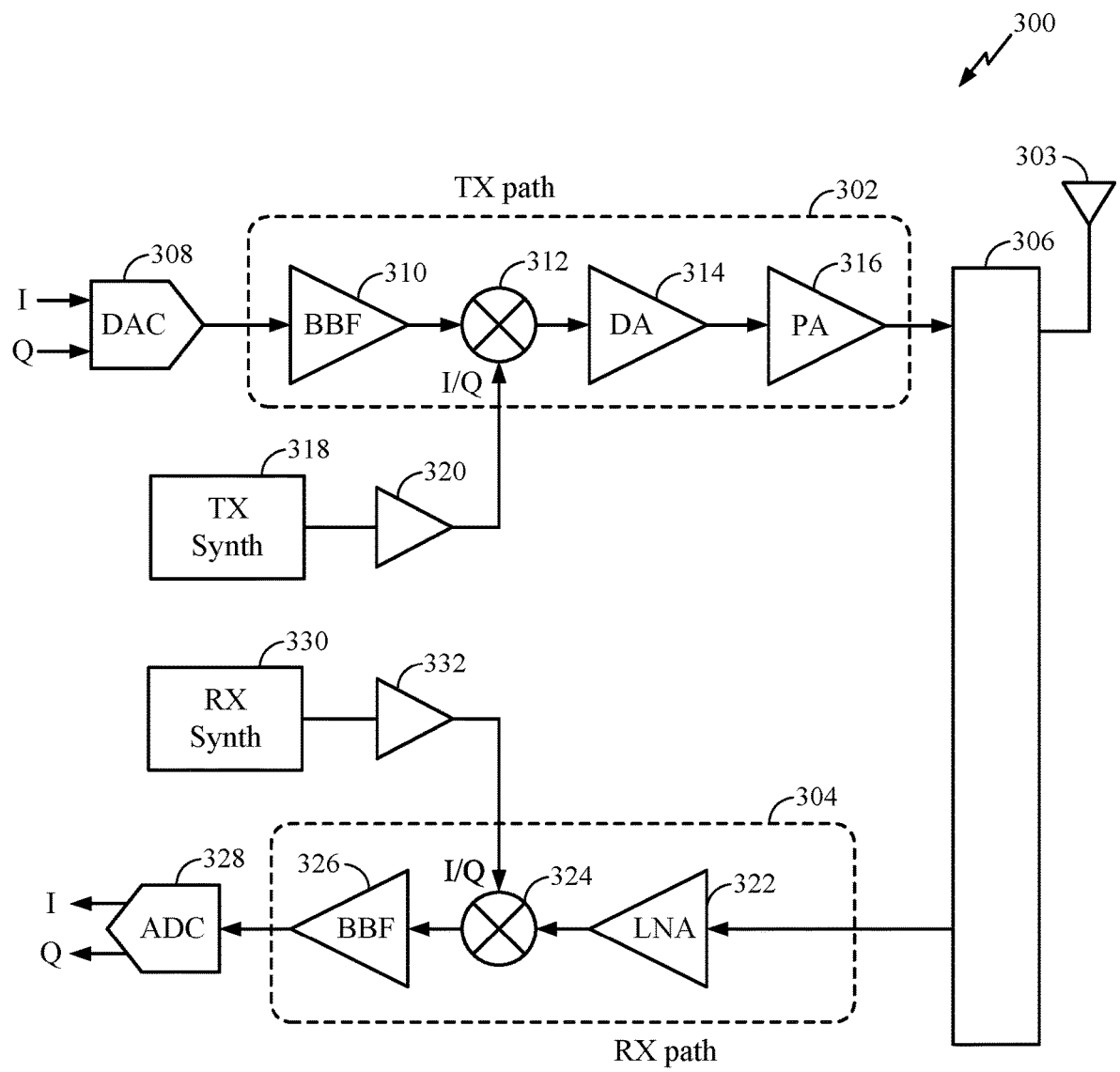
FIG. 3 is a block diagram of an example transceiver front end.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

Certain high throughput wireless communication networks (e.g., IEEE 802.11ax) may support higher order modulations (e.g., up to 1024 quadrature amplitude modulation (QAM) and higher), which generally demand relatively low transmitter distortion. For example, a transmitter using 1024 QAM may be constrained to have an error vector magnitude (EVM) below approximately −41 dB. Current EVM reduction techniques generally involve implementing power back-off and/or digital pre-distortion (DPD). Implementing power back-off, however, can lead to low efficiency (e.g., there is a tradeoff between implementing a power back-off to achieve the specified linearity and efficiency). Specifically referring to FIG. 3, for example, the PA 316 of the transceiver front end 300 may have to implement a significant power back-off in order to meet a certain transmitter distortion budget, resulting in low efficiency for the transmitter. Similarly, DPD can be used to increase PA output power, but typically occupies more circuit area and has greater costs due to higher hardware complexity. Additionally, the effectiveness of DPD generally decreases as the signal bandwidth increases. Accordingly, it may be desirable to provide a transmitter that can achieve low EVM specified for high-order modulations.

Figure 4:
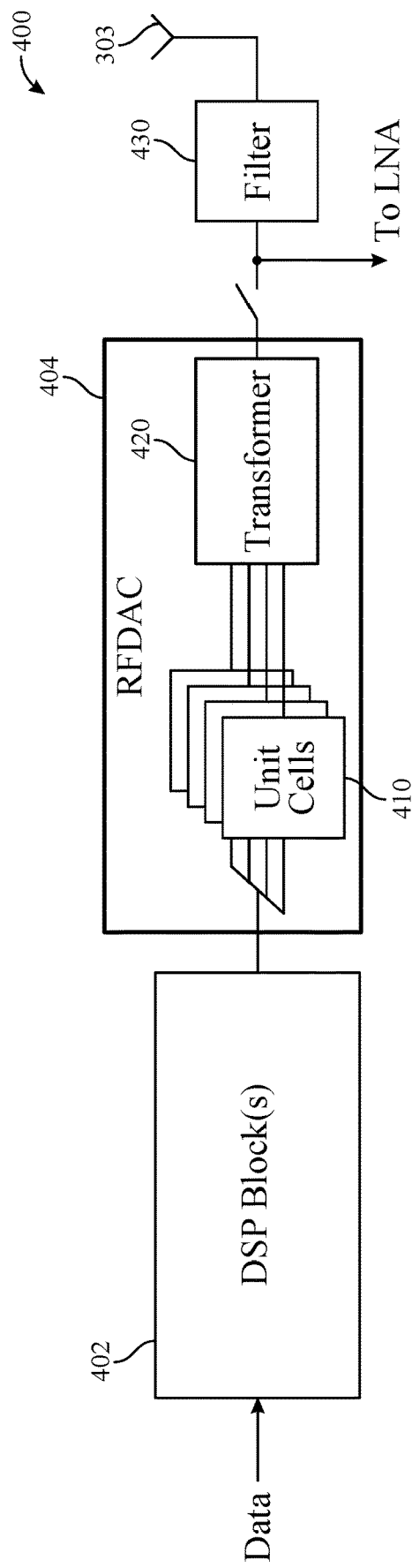
FIG. 4 is a block diagram of an example architecture of a radio frequency (RF) digital-to-analog converter (DAC) (RFDAC)-based transmitter, in accordance with certain aspects of the present disclosure.
Figure 5:
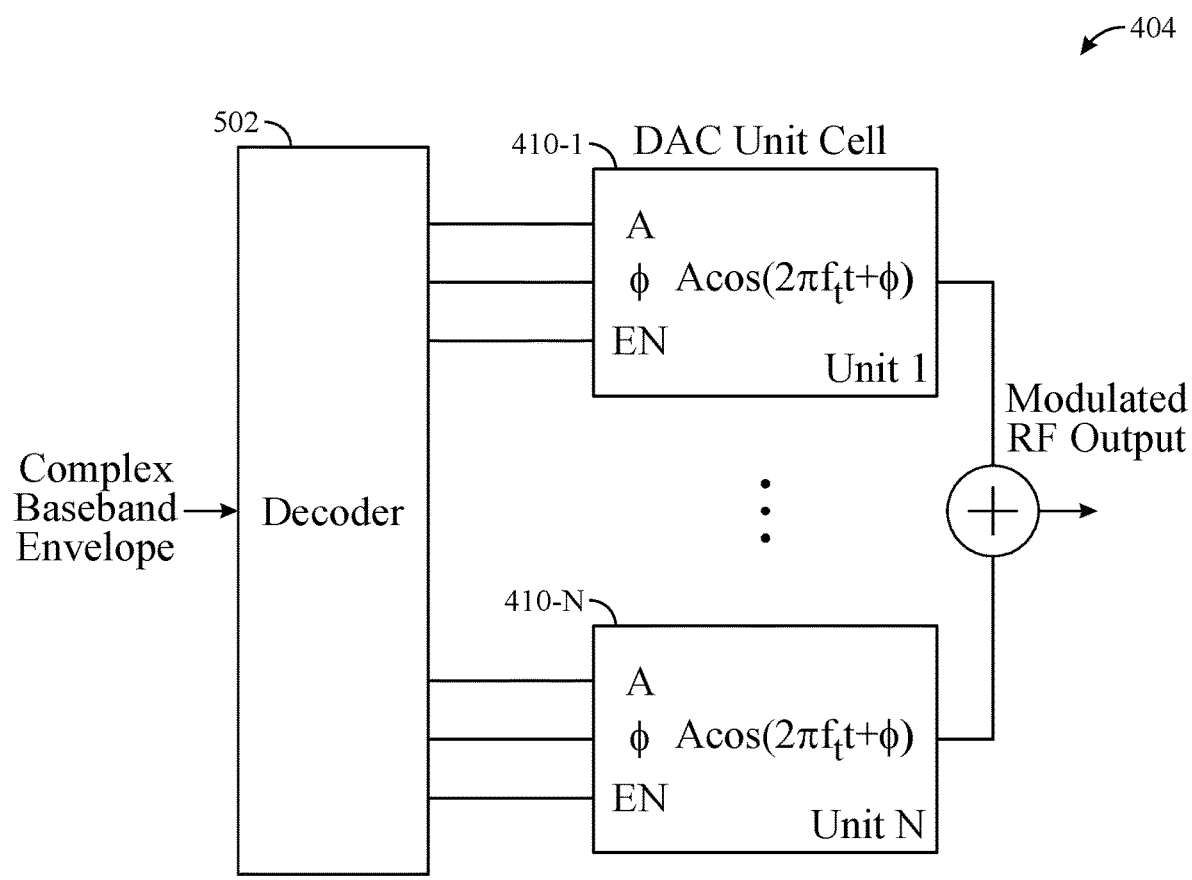
FIG. 5 illustrates DAC unit cells of an RFDAC, in accordance with certain aspects of the present disclosure.

Aspects presented herein describe a radio frequency (RF) digital-to-analog converter (DAC) (RFDAC) that can meet a desired transmitter distortion, while providing high linearity, high efficiency, and small area (e.g., relative to a conventional transmitter). FIG. 4 is a block diagram of an example architecture of an RFDAC-based transmitter 400. The RFDAC-based transmitter 400 may be included in the transceiver front end (e.g., transceiver front ends 222, 254) of a wireless communication device (e.g., access point 110, user terminal 120, etc.).

The RFDAC-based transmitter 400 includes one or more digital signal processing (DSP) blocks 402, a RFDAC 404, and a co-existent filter 430. In one aspect, one or more of the DSP block(s) 402 are implemented by a DSP (e.g., TX data processors 210, 288, etc.). The DSP block(s) 402 may implement one or more DSP operations, based on the input data. For example, assuming data (e.g., OFDM data) is received at a sampling frequency ($F_S$), a first DSP block 402 may include a fractional rate converter that interpolates the data to a rate associated with a carrier frequency ($F_C$). Additionally, a second DSP block 402 may include an upsampler that receives the interpolated data and upsamples the data to $F_C$. After upsampling, the interpolation finite impulse response (FIR) may be equivalent to the transmit BBF.

The RFDAC 404 (also referred to as a baseband DAC) generally functions as a traditional DAC, upconversion mixer, and PA. For example, the RFDAC 404 can receive the upsampled data (e.g., at $F_C$) and upconvert the upsampled data to an RF modulated signal. Here, the RFDAC 404 includes multiple unit cells 410 (also referred to herein as sub-DACs) and a transformer 420. Each unit cell 410 may upconvert baseband inputs to an RF carrier having an amplitude (A) and phase (ϕ). A sum of all of the carriers then creates the modulated RF output. The co-existent filter 430 (also referred to as a co-existence filter) is coupled to antenna 303 and is generally configured filter out frequencies in its stopband and pass frequencies within its passband to the antenna 303. The co-existent filter 430 may have a sharp transition between its passband and stopband.

In some aspects, to reduce power consumption, one or more of the unit cells 410 may be put into a sleep mode (or state). Assume, for example, that the total number of unit cells 410 is represented by variable N, such that the unit cells range from 410-1 to 410-N. In this case, a first set (or number) (M) of the N unit cells 410 may be active, and a second set (or number) (P=N−M) of the N unit cells 410 may be asleep. In aspects where there are P unit cells 410 that are asleep, the sum of the M active unit cells creates the modulated RF output.

The decoder 502 may be implemented as one or more of the DSP block(s) 402. In one aspect, the decoder 502 can decode the complex baseband input data and drive the bank of unit cells 410, e.g., by configuring the amplitude (A) and phase (ϕ) of each unit cell 410, as well as by controlling the active or sleep state. The amplitude (A) and phase (ϕ) of each unit cell 410 may be selected from multiple amplitudes and phases. In some aspects, for example, the amplitudes and phases may be determined based on a polar architecture, which involves mapping the in-phase (I)/quadrature (Q) codes to polar codes using a coordinate rotation digital computer (CORDIC) (also referred to as Volder's algorithm), and matching the amplitude and phase paths to each unit cell 410. In a unit cell assignment for a polar architecture, each unit cell 410 is either asleep or active and clocked by ϕ.

Alternatively, in some aspects, a multi-phase architecture can be used to determine the unit cell assignment (e.g., amplitude and phase). In a multi-phase architecture, an efficiency map (which may have different shapes) is divided into sectors, where each sector is bounded by two unit basis vectors $\phi_a$ and $\phi_b$ in the complex plane. In a unit cell assignment for a multi-phase architecture, each unit cell 410 is clocked by $\phi_a$, $\phi_b$, or asleep. In particular, a first set of the M active cells may be clocked by $\phi_a$ and a second set of the M active cells may be clocked by $\phi_b$. Examples of multi-phase architectures include, but are not limited to, diamond architecture (diamond-shaped efficiency map), hexagon architecture (hexagon-shaped efficiency map), octagon architecture (octagon-shaped efficiency map), decagon architecture (decagon-shaped efficiency map), etc.

Figure 6:
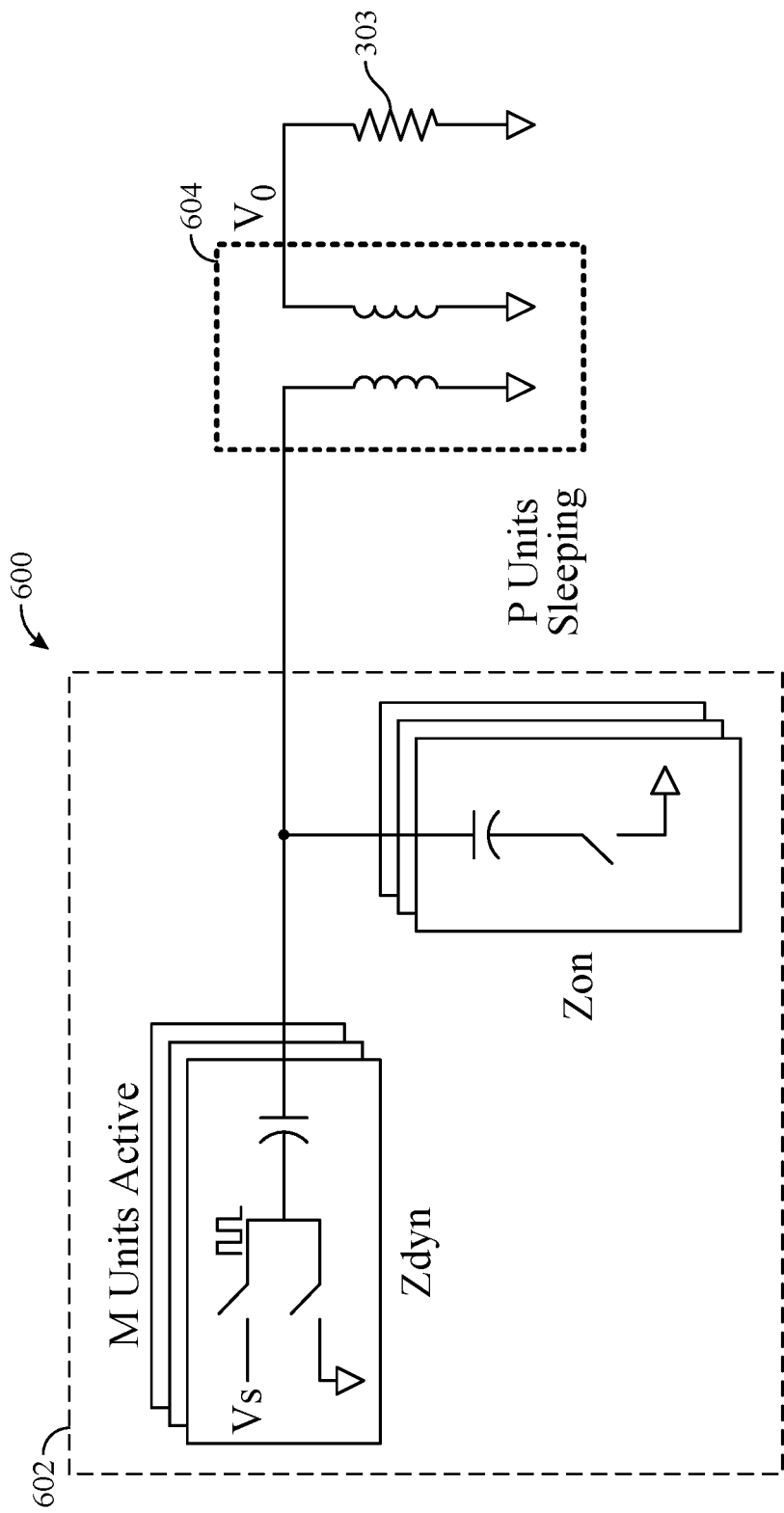
FIG. 6 illustrates an example voltage-mode architecture for an RFDAC, in accordance with certain aspects of the present disclosure.
Figure 7:
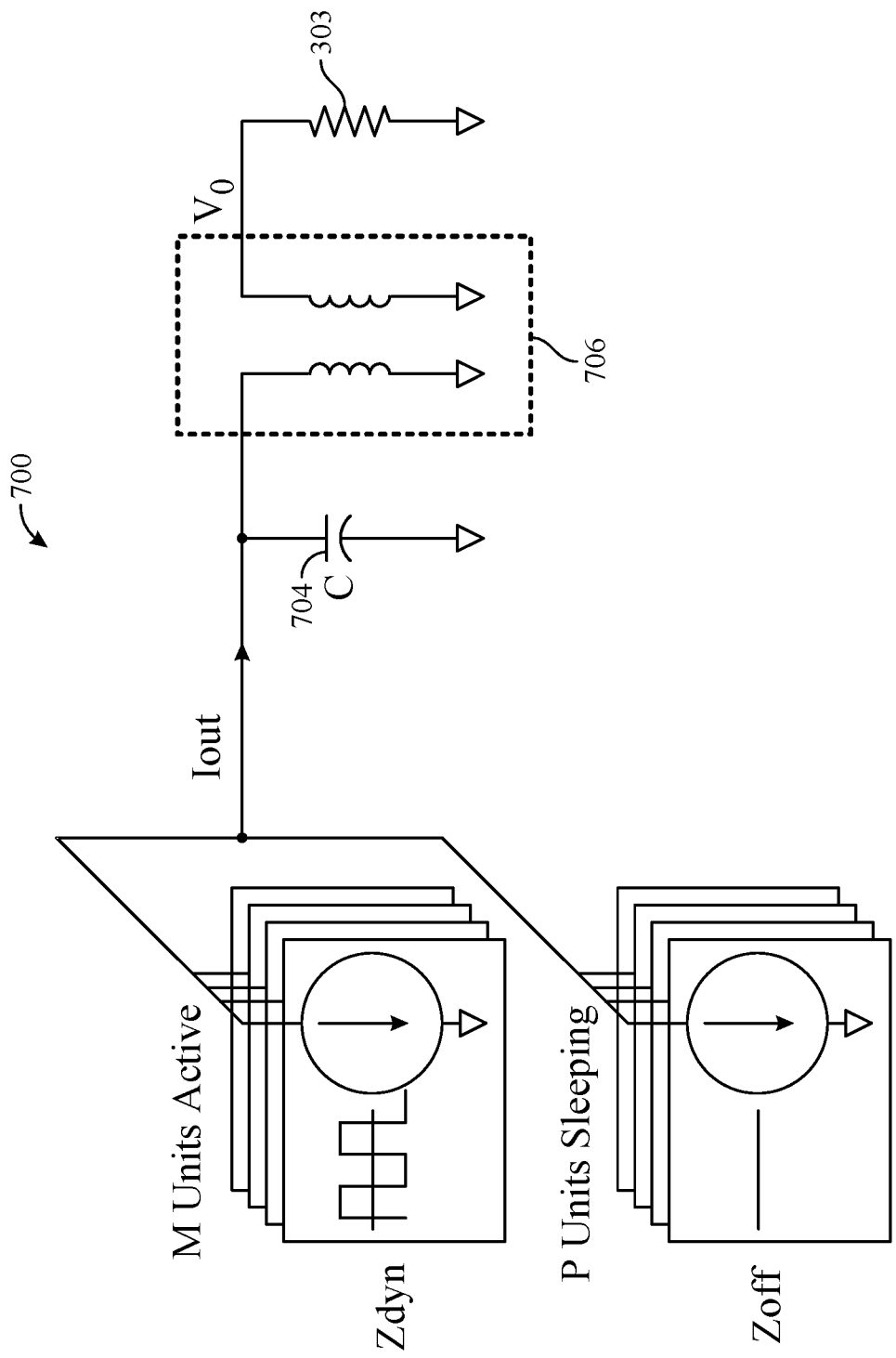
FIG. 7 illustrates an example current-mode architecture for an RFDAC, in accordance with certain aspects of the present disclosure.

The RFDAC described herein (e.g., RFDAC 404) may be implemented using a voltage-mode architecture or a current-mode architecture. FIG. 6 illustrates an example voltage-mode architecture 600 for a RFDAC. FIG. 7 illustrates an example current-mode architecture for a RFDAC.

Referring to FIG. 6, the voltage-mode architecture 600 (also referred to as a switched-capacitor power amplifier (SCPA)) includes a capacitor array 602 and a transformer 604. The capacitor array 602 includes N unit cells, where M unit cells are active and P unit cells are asleep. In this voltage-mode architecture, each of the unit cells in the capacitor array 602 is implemented with a capacitor. A primary inductance (e.g., first winding) of the transformer 604 is coupled to each of the N unit cells in series resonance, and a secondary inductance (e.g., second winding) of the transformer 604 is coupled to an antenna 303.

As shown in FIG. 6, to generate the RF modulated signal, the M active unit cells (e.g., capacitors) of the capacitor array 602 may be selectively switched (e.g., based on digital input(s) to the RFDAC) between a reference potential (e.g., ground) and a supply voltage ($V_S$) at a carrier frequency ($F_C$) of the RF modulated signal, while each P unit cell in the sleep state is coupled to the reference potential. The transformer 604 may transform the output impedance of the capacitor array 602 to match the impedance (e.g., resistance) of the antenna 303.

The impedance of the M active unit cells is represented by $Z_{dyn}$, and the impedance of the P sleeping unit cells is $Z_{on}$. Given $Z_{dyn}$ and $Z_{on}$, the output voltage envelope ($V_{o,env}$) of the voltage-mode architecture 600 can be determined using Equation (1):

$$V_{o,env} = \frac{V_s Z_{on} M}{Z_{on} M + Z_{dyn}(N - M)} \quad (1)$$

If the impedance mismatch between $Z_{on}$ and $Z_{dyn}$ is represented as α (e.g., using Equation (2)), then the output voltage envelope ($V_{o,env}$) can be represented using Equation (3), which is commonly known as the AM-AM curve:

$$\alpha = \frac{Z_{on} - Z_{dyn}}{Z_{dyn}} \quad (2)$$

$$V_{o,env} = \frac{V_s(\alpha + 1)M}{\alpha M + N} \quad (3)$$

To evaluate the distortion of the voltage-mode architecture, the denominator of Equation (3) can be expanded using a power series as shown in Equation (4). From Equation (4), the second-order and third-order harmonic distortion components $HD_2$ and $HD_3$ can be represented with Equations (5) and (6), respectively.

$$V_{o,env} = V_s(\alpha + 1)\left[\left(\frac{M}{N}\right) - \left(\frac{M}{N}\right)^2 \alpha + \left(\frac{M}{N}\right)^3 \alpha^2 + \ldots \right] \quad (4)$$

$$HD_2 = \frac{a_2 M}{2a_1 N} = -\alpha\left(\frac{M}{N}\right) \quad (5)$$

$$HD_3 = \frac{a_3}{4a_1}\left(\frac{M}{N}\right)^2 = \frac{\alpha^2}{4}\left(\frac{M}{N}\right)^2 \quad (6)$$

FIG. 7, the current-mode architecture 700 includes N unit cells, each implemented with a current source. The current-mode architecture 700 also includes a capacitor 704 and a transformer 706. In this architecture, the capacitor 704 and the primary inductance of the transformer 706 resonate in parallel. The secondary inductance of the transformer 706 is coupled to the antenna 303. To generate the RF modulated signal: (1) for each of the M active unit cells, the current source can be modulated by a square wave at the carrier frequency ($F_C$) and (2) for each of the P sleeping unit cells, the current source is turned off. Note that the output envelope equation for the current-mode architecture 700 may be similar to Equation (3), except that the impedance mismatch a is represented with Equation (7):

$$\alpha = \frac{Z_{off} - Z_{dyn}}{Z_{dyn}} \quad (7)$$

Figure 8:
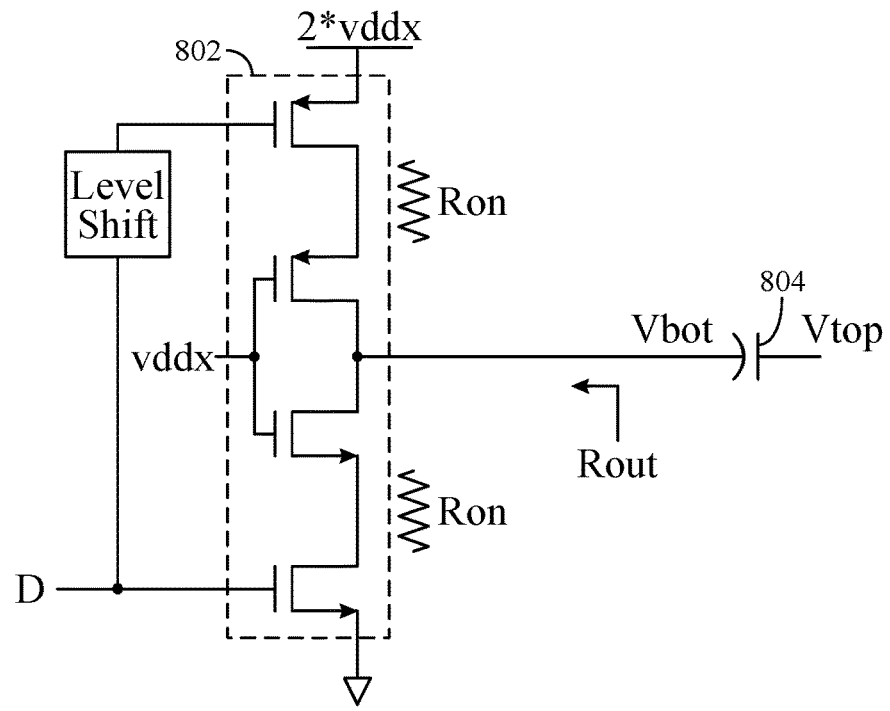
FIG. 8 illustrates an example circuit of a DAC unit cell with a dynamic impedance mismatch.
Figure 9:
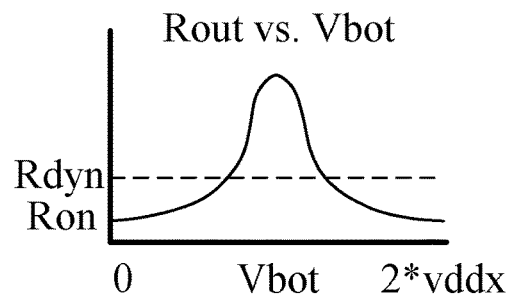
FIG. 9 is a table of output resistance (Rout) of a unit cell for different modes.

One issue with RFDACs implemented with the voltage-mode architecture 600 or the current-mode architecture 700 is that the unit cell output impedances may not match between the active and sleep modes. Consider, for example, FIG. 8 which illustrates a circuit with an inverter 802 driving the bottom plate (e.g., terminal) of a unit cell (e.g., represented here as capacitor 804, assuming a voltage-mode architecture). As shown in FIG. 9, with this circuit, when the unit cell (e.g., capacitor 804) is in sleep mode (e.g., input logic state is high), the output resistance ($R_{out}$) is $R_{on}$ (or, more generally, $Z_{on}$). Similarly, as shown in FIG. 9, when the carrier frequency ($F_C$) is low and the unit cell is active (e.g., active-slow mode), then the output resistance is also approximately $R_{on}$ (e.g., due to $V_{bot}$ spending most of the time at the power supply rails). However, as shown in FIG. 9, when the carrier frequency ($F_C$) is high and the unit cell is active (e.g., active-fast mode), then the output resistance is $R_{dyn}$ (or, more generally, $Z_{dyn}$), which is higher than $R_{on}$, because $V_{bot}$ spends most of its time transitioning. For $V_{bot}$ in the middle of the supply rails, the output resistance may reach the highest value because both the NMOS and PMOS transistors are in saturation. The output resistance mismatch between $R_{dyn}$ in active mode and $R_{on}$ in sleep mode can worsen the AM-AM curve and degrade EVM.

Figure 10:
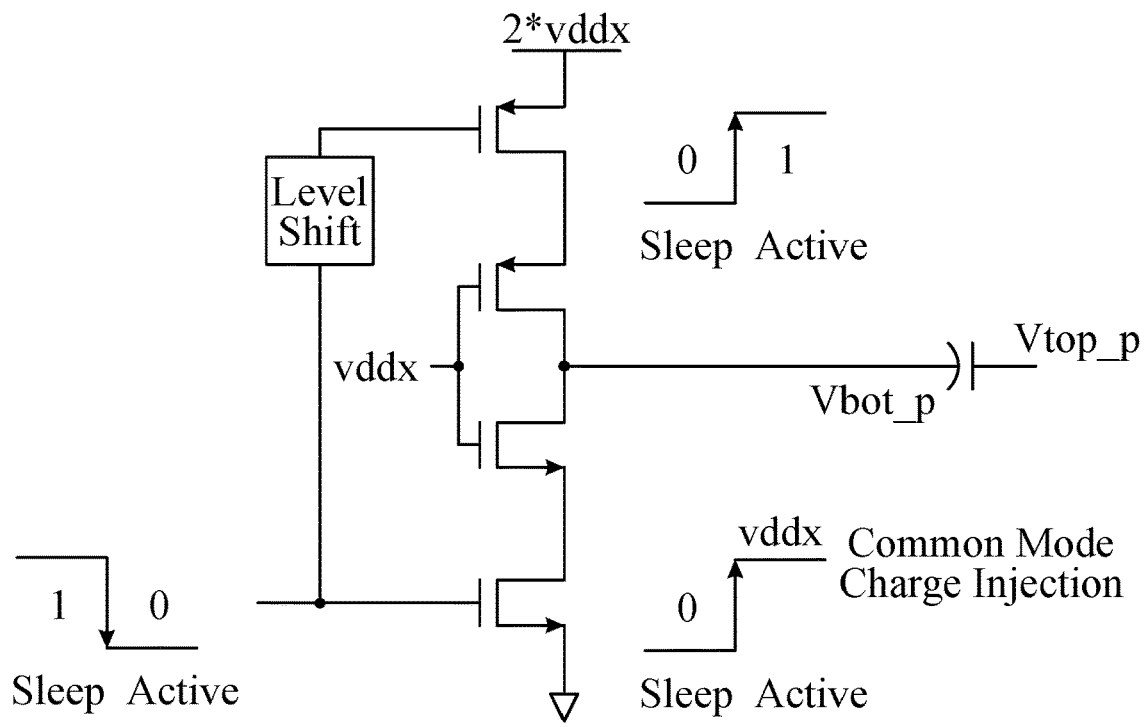
FIG. 10 illustrates example common-mode charge injection that occurs with a DAC unit cell waking up from sleep mode.
Figure 10:
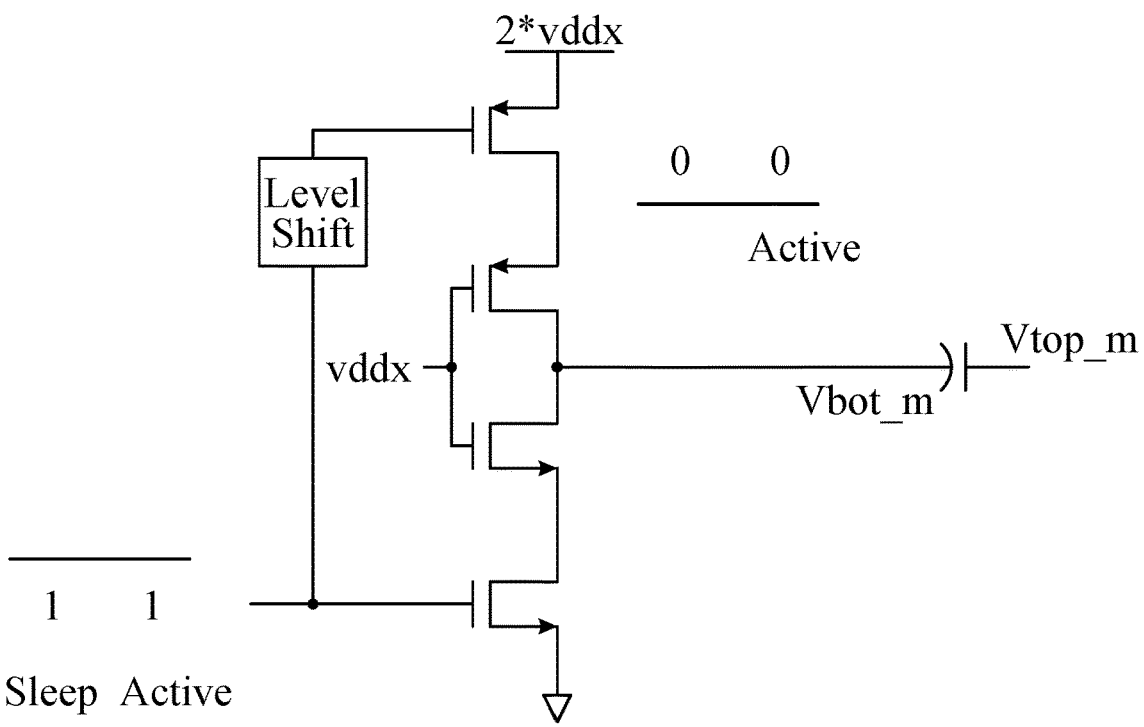

Another issue with RFDACs implemented with the voltage-mode architecture 600 is that the unit cells waking up and falling asleep can cause signal-dependent charge injection, which can degrade EVM. Consider, for example, FIG. 10 which shows a unit cell waking up. Here, during sleep mode, $V_{bot\_p}$ and $V_{bot\_m}$ are both zero, due to the input being 1. After waking up, the switches may inject a common-mode charge into the capacitor array. The amount of the common-mode charge may depend on the number of unit cells waking up. Other active unit cells may convert this common-mode charge into a signal-dependent differential-mode error that degrades EVM.

Aspects presented herein provide an improved RFDAC design that can achieve dynamic impedance matching of the unit cells of the RFDAC between active and sleep modes. In certain aspects, the improved RFDAC described herein can also be used to eliminate the common-mode charge injection that occurs when one or more unit cells wake up from sleep mode.

Figure 11:
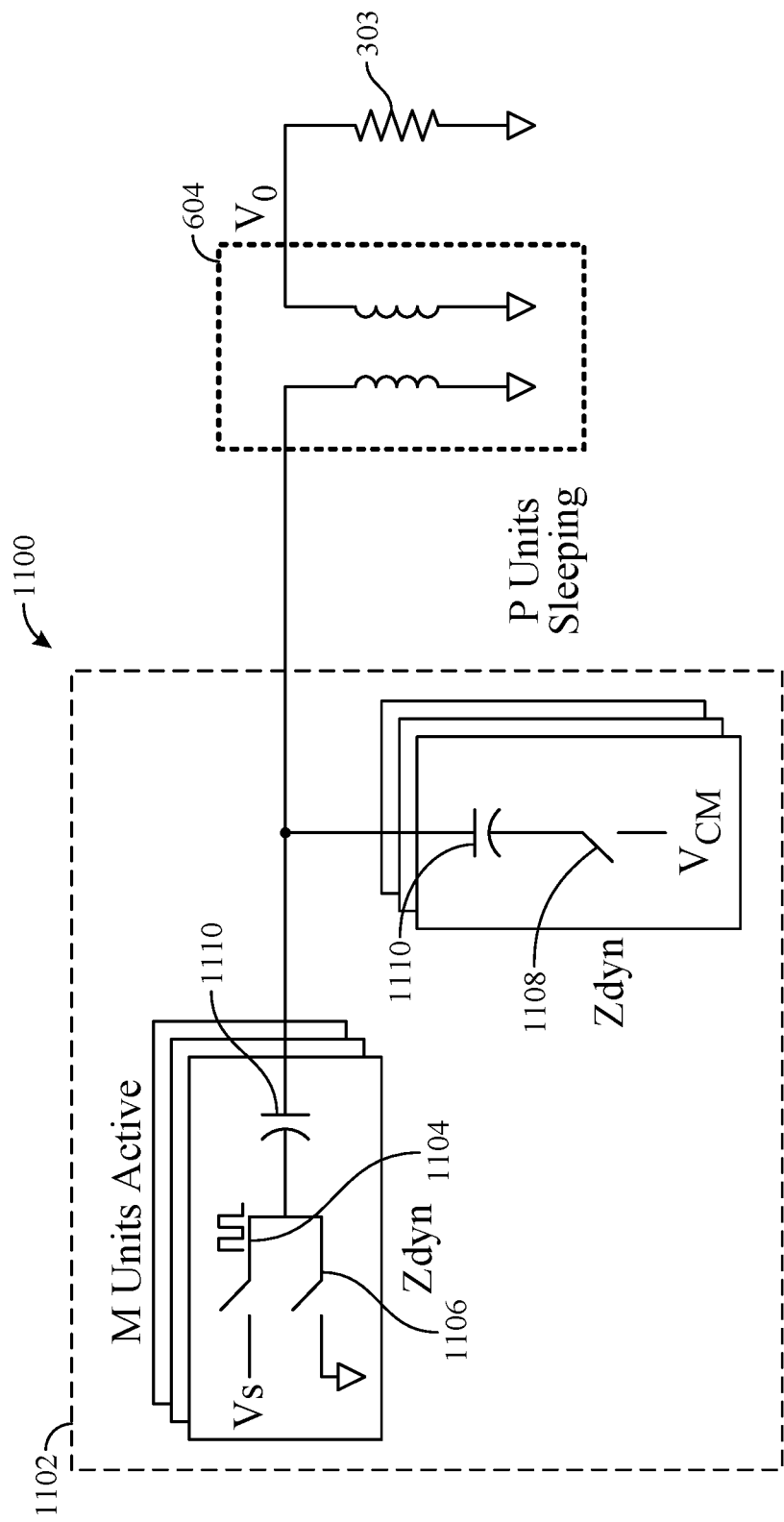
FIG. 11 illustrates an example voltage-mode architecture for an improved RFDAC, in accordance with certain aspects of the present disclosure.

FIG. 11 illustrates an example voltage-mode architecture 1100 for an RFDAC (e.g., RFDAC 404), according to certain aspects of the present disclosure. The voltage-mode architecture 1100 includes a capacitor array 1102 and the transformer 604. The capacitor array 1102 includes N unit cells, where M unit cells are active and P unit cells are asleep. In this voltage-mode architecture, each of the unit cells in the capacitor array 1102 is implemented with a capacitor 1110. A primary inductance (e.g., first winding) of the transformer 604 is coupled to each of the N unit cells in series resonance, and a secondary inductance (e.g., second winding) of the transformer 604 is coupled to an antenna 303.

Compared to the voltage-mode architecture 600 of FIG. 6, each of the unit cells in the voltage-mode architecture 1100 of FIG. 11 is configured with a (sleep) switch 1108 to set $Z_{on}$ equal to $Z_{dyn}$ during sleep. In one aspect, $Z_{on}$ may be set to $Z_{dyn}$ using a passive network with zero static power consumption. For example, although not shown in FIG. 11, the passive network can include one or more circuit elements, such as switches, resistors, capacitors, inductors, bias voltages, etc. In some aspects, $Z_{on}$ (during the sleep state) may be equal to the (output) impedance of the passive network of circuit elements. One advantage of a passive network of circuit elements is that it can present an output impedance $Z_{on}$, while using zero static power consumption during the sleep state.

Each unit cell in the voltage-mode architecture 1100 is configured with a switch 1104, a switch 1106, and a switch 1108. The switch 1104 is configured to selectively couple the terminal of the capacitor 1110 to a power supply rail (e.g., $V_S$ or 2*vddx). The switch 1106 is configured to selectively couple the terminal of the capacitor 1110 to a reference potential node (e.g., ground). The (sleep) switch 1108 is configured to selectively couple the terminal of the capacitor 1110 to a common-mode voltage node ($V_{CM}$) (e.g., at vddx). In one aspect, the bias voltage of the common-mode voltage node is equal to half of the supply voltage of the power supply rail.

During a sleep state, the switch 1104 and the switch 1106 are configured to be open, and the switch 1108 is configured to be closed. During an active state, the switch 1104 and the switch 1106 are configured to be selectively closed, e.g., based on a digital signal input to the RFDAC, and the switch 1108 is configured to be open. Thus, as shown in FIG. 11, for each of the M active unit cells, a terminal of the capacitor 1110 is selectively switched between $V_S$ at a carrier frequency and a reference potential, based on a digital signal input to the RFDAC. Similarly, for each of the P sleeping unit cells, a terminal of the capacitor 1110 is coupled to the common-mode voltage node. In this manner, the output resistance ($R_{out}$) as seen by the bottom plate of the capacitor remains constant (at $R_{dyn}$) when switching between sleep and active states.

Figure 12:
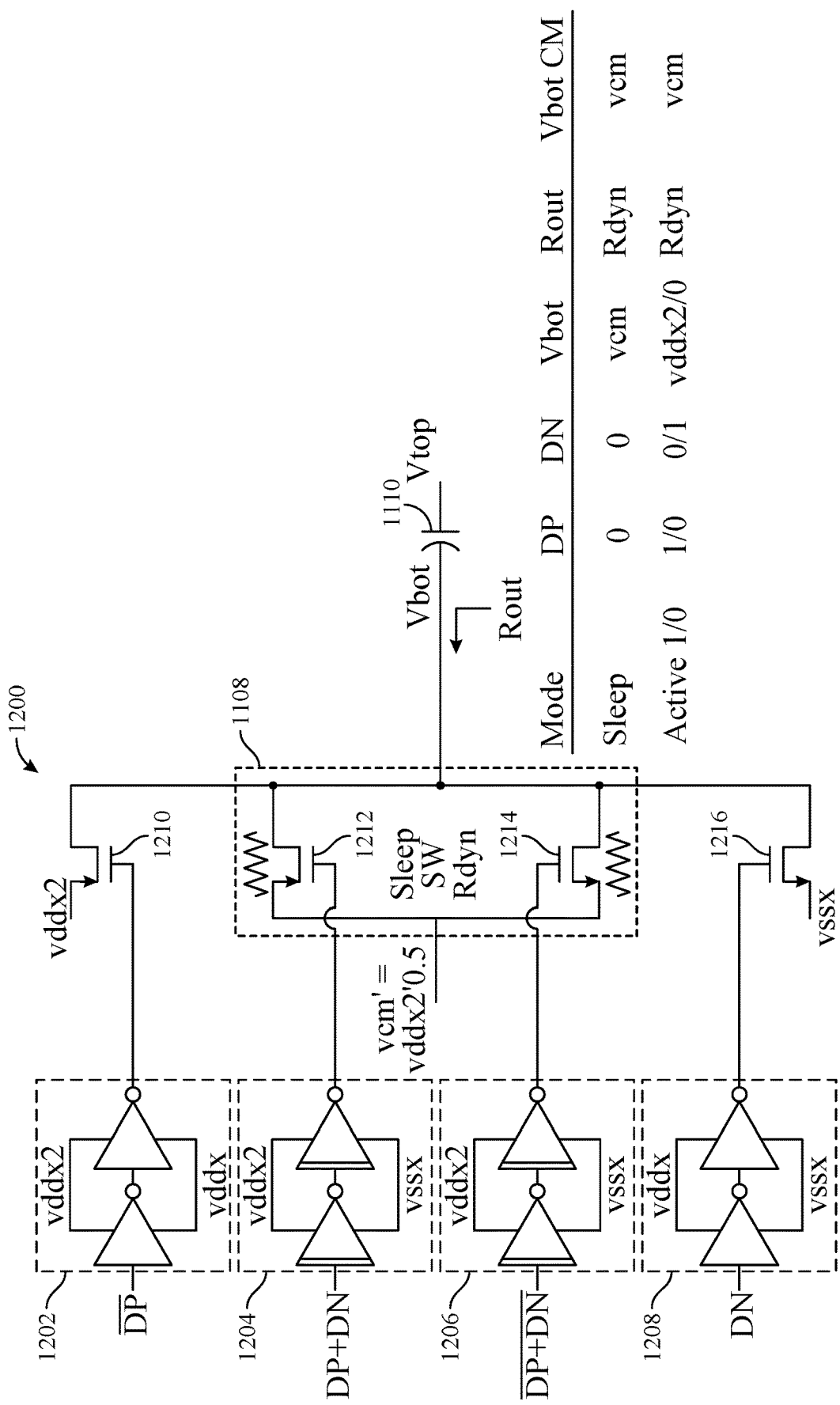
FIG. 12 illustrates a circuit for a unit cell of an improved RFDAC, in accordance with certain aspects of the present disclosure.

FIG. 12 illustrates a circuit 1200 for a unit cell of a RFDAC with a sleep switch (e.g., switch 1108), according to certain aspects of the present disclosure. Here, the circuit 1200 includes inverter chains 1202, 1204, 1206, and 1208 and transistors 1210, 1212, 1214, and 1216. The inverter chain 1202 is configured to drive (PMOS) transistor 1210, the inverter chain 1204 is configured to drive (PMOS) transistor 1212, the inverter chain 1206 is configured to drive (NMOS) transistor 1214, and the inverter chain 1206 is configured to drive (NMOS) transistor 1216.

In circuit 1200, the sleep switch (e.g., switch 1108) is implemented with (PMOS) transistor 1212 and (NMOS) transistor 1214. As shown, a drain of the transistor 1212 and a drain of the transistor 1214 are coupled to the terminal of the capacitor 1110. A source of the transistor 1212 and a source of the transistor 1214 are coupled to the common-mode voltage node ($V_{CM}$), which is set to half of the power supply rails (vcm=vddx2/2). The switch 1108 sets $R_{out}$ (e.g., $Z_{out}$)=$R_{dyn}$ (e.g., $Z_{dyn}$) during sleep mode of the unit cell. This removes the impedance mismatch of the unit cell between active and sleep modes. Additionally, by setting $V_{bot}$ to $V_{CM}$ in sleep mode, the switch 1108 can eliminate the common-mode charge injection. Note that the $V_{CM}$ node may not have direct current. Note that in aspects herein, the sleep switch can be used to resolve the impedance mismatch within a predefined tolerance level (or range). For example, the sleep switch can be used to match the impedance of the unit cell between active and sleep modes within 5%, 1%, or even smaller. In some examples, the sleep switch can be used to exactly match the impedance of the unit cell between active and sleep modes.

Figure 13:
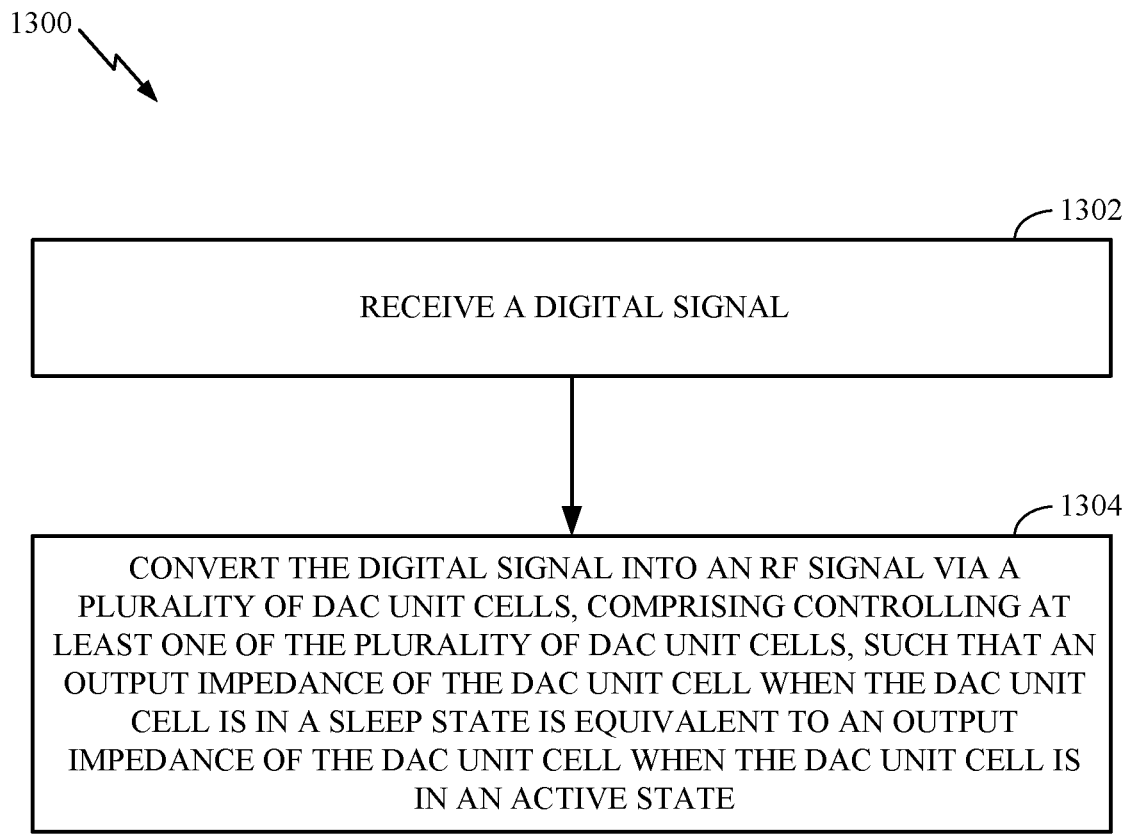
FIG. 13 is a flow diagram of example operations for generating an RF signal, in accordance with certain aspects of the present disclosure.

FIG. 13 is a flow diagram of example operations 1300 for generating an RF signal, in accordance with certain aspects of the present disclosure. The operations 1300 may be performed by a circuit, such as the RFDAC 404.

The operations 1300 begin, at block 1302, by receiving a digital signal. At block 1304, the circuit converts the digital signal into an RF signal via a plurality of DAC unit cells (e.g., unit cells 410). The operations at block 1304 may include controlling at least one of the plurality of DAC unit cells, such that an output impedance of the DAC unit cell when the DAC unit cell is in a sleep state is equivalent to an output impedance of the DAC unit cell when the DAC unit cell is in an active state.

In some aspects, the operations at block 1304 may include (i) setting each of a first subset (e.g., M unit cells) of the plurality of DAC unit cells in the active state to generate the RF signal and (ii) setting each of a second subset (e.g., P unit cells) of the plurality of DAC unit cells in the sleep state.

In some aspects, the controlling of the at least one DAC unit cell may further include controlling a gate voltage of one or more transistors of at least one DAC unit cell when in the sleep state to half of a power supply rail, to prevent a common-mode charge injection when the at least one DAC unit cell switches from the sleep state to the active state.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein. For example, one or more DSP block(s) 402 may be implemented or performed with a general purpose processor, a DSP, an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A transmitter circuit configured to generate a signal for wireless transmission, the transmitter circuit comprising:
   a switched-capacitor array comprising a plurality of unit cells, wherein:
      each of the plurality of unit cells comprises a capacitor; and
      for at least a first unit cell of the plurality of unit cells, a terminal of the capacitor of the first unit cell is configured to be selectively coupled to a reference potential node, to a power supply rail, and to a common-mode voltage node,
      wherein the first unit cell comprises:
         a first switch configured to selectively couple the terminal of the capacitor of the first unit cell to the reference potential node;
         a second switch configured to selectively couple the terminal of the capacitor of the first unit cell to the power supply rail; and
         a third switch configured to selectively couple the terminal of the capacitor of the first unit cell to the common-mode voltage node.

2. The transmitter circuit of claim 1, wherein the first unit cell is capable of being configured in a first state or in a second state, the second state being different from the first state.

3. The transmitter circuit of claim 2, wherein an output impedance of the first unit cell in the first state is equal to an output impedance of the first unit cell in the second state.

4. The transmitter circuit of claim 2, wherein:
   the first switch and the second switch are configured to be open during the second state; and
   the third switch is configured to be closed during the second state.

5. The transmitter circuit of claim 4, wherein:
   the first switch and the second switch are configured to be selectively closed during the first state based on a signal input to the switched-capacitor array; and
   the third switch is configured to be open during the first state.

6. The transmitter circuit of claim 1, wherein:
   the third switch comprises a p-type metal-oxide-semiconductor (PMOS) transistor and an n-type metal-oxide-semiconductor (NMOS) transistor;

a drain of the PMOS transistor and a drain of the NMOS transistor are coupled to the terminal of the capacitor of the first unit cell; and a source of the PMOS transistor and a source of the NMOS transistor are coupled to the common-mode voltage node.

7. The transmitter circuit of claim 1, wherein a bias voltage of the common-mode voltage node is half of a supply voltage of the power supply rail.

8. The transmitter circuit of claim 1, wherein:
the first unit cell is clocked by a signal having a first phase or a second phase; and
at least one of the first phase or the second phase is based on a multi-phase architecture.

9. The transmitter circuit of claim 8, wherein the multi-phase architecture comprises a diamond architecture, a hexagon architecture, an octagon architecture, or a decagon architecture.

10. A wireless communication device comprising:
a switched-capacitor array configured to generate a signal at a transmission frequency and comprising a plurality of unit cells, wherein:
each of the plurality of unit cells comprises a capacitor and is capable of being configured in a first state or in a second state, the second state being different from the first state; and
for at least a first unit cell of the plurality of unit cells, the first unit cell is configured to couple a terminal of the capacitor of the first unit cell to a common-mode voltage node during the second state; and
an antenna configured to output signals for wireless transmission at the transmission frequency,
wherein the first unit cell is further configured to selectively couple the terminal of the capacitor to a reference potential node or to a power supply rail during the first state, and
wherein the first unit cell comprises:
a first switch configured to selectively couple the terminal of the capacitor of the first unit cell to the reference potential node;
a second switch configured to selectively couple the terminal of the capacitor of the first unit cell to the power supply rail; and
a third switch configured to selectively couple the terminal of the capacitor of the first unit cell to the common-mode voltage node.

11. The wireless communication device of claim 10, wherein:
the first switch and the second switch are configured to be open during the second state; and
the third switch is configured to be closed during the second state.

12. The wireless communication device of claim 11, wherein:
the first switch and the second switch are configured to be selectively closed during the first state based on a signal input to the switched-capacitor array; and
the third switch is configured to be open during the first state.

13. The wireless communication device of claim 10, wherein:
the third switch comprises a p-type metal-oxide-semiconductor (PMOS) transistor and an n-type metal-oxide-semiconductor (NMOS) transistor;

a drain of the PMOS transistor and a drain of the NMOS transistor are coupled to the terminal of the capacitor of the first unit cell; and
a source of the PMOS transistor and a source of the NMOS transistor are coupled to the common-mode voltage node.

14. The wireless communication device of claim 10, wherein an output impedance of the first unit cell in the first state is equal to an output impedance of the first unit cell in the second state.

15. The wireless communication device of claim 10, wherein a bias voltage of the common-mode voltage node is half of a supply voltage of a power supply rail.

16. The wireless communication device of claim 10, wherein:
the first unit cell is clocked by a signal having a first phase or a second phase; and
at least one of the first phase or the second phase is based on a multi-phase architecture.

17. The wireless communication device of claim 16, wherein the multi-phase architecture comprises a diamond architecture, a hexagon architecture, an octagon architecture, or a decagon architecture.

18. The wireless communication device of claim 10, wherein the antenna is coupled to an output of the switched-capacitor array and wherein another terminal of the capacitor of the first unit cell is coupled to the output of the switched-capacitor array.

19. The wireless communication device of claim 10, wherein the first state comprises an active state and the second state comprises a sleep state.

20. A wireless communication device, comprising:
a switched-capacitor array configured to generate a signal at a transmission frequency and comprising a plurality of unit cells, wherein:
each of the plurality of unit cells comprises a capacitor and is capable of being configured in a first state or in a second state, the second state being different from the first state; and
for at least a first unit cell of the plurality of unit cells, the first unit cell is configured to couple a terminal of the capacitor of the first unit cell to a common-mode voltage node during the second state;
an antenna configured to output signals for wireless transmission at the transmission frequency, wherein the antenna is coupled to an output of the switched-capacitor array and wherein another terminal of the capacitor of the first unit cell is coupled to the output of the switched-capacitor array; and
a transformer including a primary winding coupled to the output of the switched-capacitor array and including a secondary winding coupled to the antenna.

21. The wireless communication device of claim 20, wherein an output impedance of the first unit cell in the first state is equal to an output impedance of the first unit cell in the second state.

22. The wireless communication device of claim 20, wherein a bias voltage of the common-mode voltage node is half of a supply voltage of a power supply rail.

23. The wireless communication device of claim 20, wherein:
the first unit cell is clocked by a signal having a first phase or a second phase; and
at least one of the first phase or the second phase is based on a multi-phase architecture.

* * * * *